United States Patent [19]

Hatzakis et al.

[11] 4,156,745
[45] May 29, 1979

[54] ELECTRON SENSITIVE RESIST AND A METHOD PREPARING THE SAME

[75] Inventors: Michael Hatzakis, Ossining; David J. Webb, Briarcliff Manor, both of N.Y.

[73] Assignee: International Business Machines Corporation, Armonk, N.Y.

[21] Appl. No.: 893,093

[22] Filed: Apr. 3, 1978

[51] Int. Cl.$^2$ ................................................. B05D 3/06
[52] U.S. Cl. ........................................ 427/43; 96/35.1; 96/115 R; 204/159.22; 427/273
[58] Field of Search ................. 427/43, 273; 96/35.1, 96/36.2, 115 R; 204/159.14, 159.22

[56] References Cited

PUBLICATIONS

Feder et al., I "IBM Tech. Disc. Bull." 18, 7 (1975) pp. 2346, 7.
Brault "Chem. Abstr." 83, 35630 (1975).
Hiraoka et al. "IBM Tech. Disc. Bull." 20, 5 (1977) p. 1922.
Feder et al. II "IBM Tech. Disc. Bull." 18, 7 (1975) pp. 2343, 4, 5.
Rohm and Haas "Chem. Abstr." 71, 22606 (1969).

*Primary Examiner*—John H. Newsome
*Attorney, Agent, or Firm*—Hansel L. McGee

[57] ABSTRACT

A high speed high contrast electron resist composition comprising a copolymer of polymethylmethacrylate/-methacrylic acid having incorporated therein a metal selected from the group consisting of lead, barium, calcium and strontium is disclosed. The metal is present in the range of from about 0.001% to about 10% by weight of the copolymer.

10 Claims, 4 Drawing Figures

ELECTRON SENSITIVE RESIST AND A METHOD PREPARING THE SAME

DESCRIPTION

Background of the Invention

Microcircuitry manufacture requires that patterns be made to define the various circuit elements. This is done using polymeric materials called resist which are sensitive to various types of radiation, for example, electrons, UV light or X-rays. The use of Alkyl methacrylate polymers as electron beam degradable polymers, for the formation of resist mask which are useful in the fabrication of integrated circuits, printing plates and the like has been proposed heretofore. For instance U.S. Pat. No. 3,535,137 granted on Oct. 20, 1970 to Haller et al, teaches among other things the use of methacrylate polymers containing a quaternary carbon polymer backbone such as polymethylmethacrylate and copolymers of methacrylate with 2-hydroxy ethyl methacrylate for such purpose. In addition U.S. Pat. No. 3,779,806 granted on Dec. 19, 1973 to Gipstein et al discloses the use of certain polymers P-butylmethacrylate for such purpose. Related discussions are contained in the articles "Polymethylmethacrylate as Electron Sensitive Resist" by R. A. Harris, J. Electrical Chemical Society, Vol. 120, No. 2, Pgs. 270–274, February 1973, and "Modified Methacrylate Positive Electron Resist" by E. D. Roberts, Applied Polymers Symposium, No. 23, pg. 87–98 (1974). Additionally, the publication to R. Feder et al, entitled "Heavy Metal Salts of Acidic Copolymers for Use as Radiation Sensitive Resist," IBM Technical Disclosure Bulletin, Vol. 18, No. 7, December 1975, discloses copolymer of methyl methacrylate and methacrylic acid having salt of heavy metals such as cesium and thallium is disclosed.

In the manufacturing of microcircuitry by electron beam lithography it is important that a positive resist should have several of the following properties. For example, it should be highly sensitive to the exposing radiation. This is necessary for short exposure times and therefore a high production rate. A high contrast between the exposed and unexposed regions is necessary to give good control of pattern geometry. Good mechanical stability at high temperatures is also necessary to preserve the pattern during any subsequent manufacturing operations which involves high temperatures. Resistance to chemicals used in etching or plating operations is also required. It is equally important that when the resist is developed and removed, it does not leave a residue on the substrate which might hinder subsequent operations. It is also helpful that thick films can be used. This is particularly important during additive metallizations for example, lift-offs. The resist thickness is often limited by cracking during development.

Accordingly it is the object of the present invention to provide a material for forming a positive resist image when exposed to electron beams which meets all of the above requirements for a positive resist.

SUMMARY OF THE INVENTION

The present invention is concerned with a method for production of a positive resist image comprising the steps of (a) exposing a film of a non-crosslink polymeric material to electron beam radiation in a predetermined pattern wherein the polymeric material is a:

(1) polymeric material containing
  (a) polymerized alkylmethacrylate units wherein the alkyl group contains from 1 to 4 carbon atoms and
  (b) polymerized units of a methacrylate salt of a metal chosen from the group consisting of lead, barium, calcium and strontium and
wherein the amount of alkyl methacrylate units (a) is from about 50 to about 99 mole % and the amount of the metal salt of methylacrylate acid (b) is from about 50 to about 0.001 mole % based upon the total moles of (a) and (b) in the polymeric materials and
wherein said metal present is in the amount of from about 0.001% to 10% by weight of the copolymer. The preferred ranges of specific metals are as follows: lead from about 1% to about 4%, calcium from about 0.02 to about 0.035%, barium from about 0.05 to about 0.4, strontium from about 0.003 to about 0.02.

DESCRIPTION OF PREFERRED EMBODIMENTS

Figure 1:
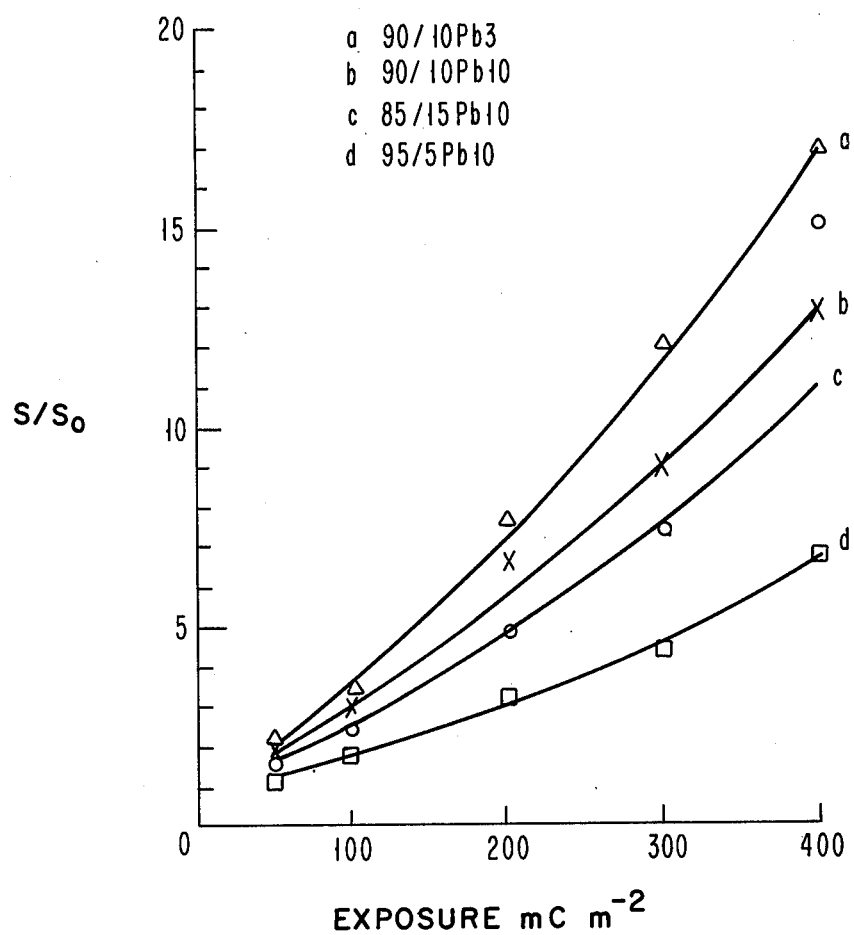
FIG. 1 is a graph displaying the solubility ratio of lead methacrylate copolymers.

One type of polymeric material which can be employed according to the present invention is a non-crosslinked polymeric material which contains polymerized alkyl methacrylate units wherein the alkyl group contains from 1 to 4 carbon atoms; and polymerized units of at least one other ethylenically unsaturated monomer containing Pb, Ba, Ca or Sr.

Exemplary of suitable alkyl methacrylate units in the polymeric material are methyl methacrylate, and t-butyl methacrylate of which methyl methacrylate is preferred. Mixtures of the alkyl methacrylate can be employed if desired. The units from the other ethylenically unsaturated monomer are selected from the Pb, Ba, Ca or Sr salts of methacrylic acid with the Pb salt being preferred. Mixtures of the units from the other ethylenically unsaturated monomers can also be employed.

The above polymeric materials can be random copolymers, graft copolymers, block copolymers, or compatible (i.e., homogeneous) mixtures of homopolymers or mixtures of any of the above when compatible. Generally the relative amount of the polymerized alkyl methyacrylate units in the above polymeric material is from about 99 to about 50 mole % and the relative amount of the polymerized units from the other ethylenically unsaturated monomer is from 1 to about 50 mole % based upon the total moles of the alkyl methacrylate units, and at least one other ethylenically unsaturated monomer units.

Preferably the polymeric material contains from about 99 to about 60 mole % of the polymerized alkyl methacrylate units and most preferably from about 99 to about 80 mole % based upon the total moles of alkyl methacrylate units.

Preferably the polymeric material contains polymerized units of the other ethylenically unsaturated monomer in amounts from about 0.01% to about 30 mole % and most preferably in amounts from about 0.5 to about 20 mole % based upon the total moles of the alkyl methacrylate and other ethylenically unsaturated monomer in the polymeric material. If desired, the polymeric material can contain minor amounts (i.e., up to about 30 mole %) of polymerized units of ethylenically unsaturated monomers other than those discussed above (i.e., methacrylic acid, acrylic acid and crotonic acid) so long as such do not adversely affect the electron beam sensitivity of the polymeric material or form insoluble residues in the exposed polymer such as by crosslinking and so long as the total amount of units of ethylenically unsaturated monomers other than the alkyl methacrylate units is no greater than about 50 mole % of the polymeric material.

Generally the polymer materials employed according to the present invention have a number average molecular weight ($\bar{M}n$) in the range of about $1 \times 10^4$ to about $10^6$ and preferably in the range of about $10^5$ to about $3 \times 10^5$ and have a weight average molecular weight ($\bar{M}\omega$) in the range of about $2 \times 10^4$ to about $2 \times 10^6$ and preferably in the range of about $2 \times 10^5$ to about $6 \times 10^5$. The polymer has a preferred dispersion index ($\bar{M}\omega/\bar{M}n$) (a measure of the breadth of distribution) less than 2.

One method for preparing copolymers employed in the present invention is by solution polymerization employing a free radical initiator. Exemplary of diluents for the solution polymerization are glacial acetic acid, other saturated organic acids liquid at room temperature e.g., formic acid, or mixtures of these with water or other organic solvents e.g. alcohols or mixtures of alcohols with water. Free radical catalysts or initiators of particular interest include azo type catalysts such as azobisisobutyronitrile and peroxide catalysts. Some examples of suitable peroxide catalysts include hydrogen peroxide, benzoyl peroxide, tert-butyl peroxide, phthalic peroxide, succinic peroxide, benzoyl acetic peroxide, coconut oil acid peroxide, lauric peroxide, stearic peroxide, oleic peroxide, tert-butyl diperphthalate, cumene hydroperoxide, tert-butylperbenzoate, acetyl peroxide, 2,4 dichlorobenzoyl peroxide, urea peroxide, caprylyl peroxide, and the like.

The amount of diluent employed depends upon the particular diluent and particular monomers used and is usually from about 0.1 parts to about 30 parts and preferably from about 0.2 parts to about 10 parts per part of polymerizable monomer.

The amount of catalyst employed depends upon the type of catalyst system used and is generally from about 0.1 to about 2.5 parts by weight per 100 parts of the polymerizable monomers, and preferably is from about 0.2 to about 1 part by weight per 100 parts of the polymerizable monomers.

The polymerization is generally carried out at temperatures between room temperature and about 150° C., and between about 50° C. and about 100° C. Usually the polymerization is conducted under autogenous pressure in a closed reaction vessel. However, any suitable means to prevent significant evaporation of any of the monomers can be employed.

If desired dissolved oxygen can be removed by suitable means e.g. freeze-pump thaw cycles and inhibitors can be removed from monomers by suitable methods e.g. washing, distillation, chromatography etc.

Generally the polymerization is complete in about 15 minutes to about 36 hours and preferably is completed in about 30 minutes to 24 hours. It is understood, of course, that the time and temperature are inversely related. That is, temperature employed at the upper end of the temperature range will provide polymerization processes which can be completed near the lower end of the time range.

The polymeric materials employed in the present invention are normally coated on a substrate from a solution of the polymeric material in any suitable manner such as by spin casting or dipping, and then dried to remove the volatile matter. The solution of polymeric material should be compatible with the substrate. The solvents employed should have boiling points below the decomposition point of the polymeric material employed in order to permit removal of the solvent from the cast film by heating. Exemplary of some suitable solvents are ethyl cellosolve acetate, chlorobenzene, liquid saturated, carboxylic acids, halogenated hydrocarbons, e.g. chlorobenzene, ketones e.g. methyl ethylketone, cellosolves, Dimethyl formamide, Dimethyl sulfoxide, tetrahydrofuran.

The determination of a specific solvent system for a particular polymeric material primarily depends upon the chemical identity of the polymeric material and upon the molecular weight and is readily ascertainable.

The polymeric films can be cast in various thicknesses and particularly from about 1000 angstroms to about 2 microns. The particular thickness will depend upon the type of processing to be employed. For instance 0.5 to 2 microns is generally desirable for etch processing whereas from about 1.0 to about 3 microns is generally used for lift off metallurgical processing.

In addition, it is preferred to prebake the polymeric material film in air or in vacuum at a temperature generally above the glass transition temperature of the polymeric material but below the thermal decomposition temperature thereof. The prebaking is intended to remove trace amounts of the solvent employed in the coating step and also to anneal out strains in the polymeric film. Some exemplary prebake temperatures are about 70° C. to about 250° C. for copolymers of methyl methacrylate and metal methacrylates. The preferred temperature range for prebaking is from about 140° C. to about 200° C.

Various substrates can be employed as supports for the polymer resist of the present invention. For example, an application of the polymer resist in the fabrication of semiconductor devices, or integrated circuits, the substrate can comprise semiconductor wafers of chips overcoated with oxides and nitrides such as silicon oxide/silicon nitride for diffusion masks and passivation steps for forming contacts and conductor patterns on the semiconductor chip.

After the polymeric film is dried, it is exposed to a pattern defining electron beam radiation to delineate the necessary pattern required in the processing such as in integrated circuits. The enhanced sensitivity of the polymeric materials in conjunction with the appropriate developers render such particularly useful for a process employing a low dose electron beam radiation. The specific exposure flux will normally be dependent upon the particular polymeric material selected and upon the thicknesses of the polymeric resist. Generally, for exposure of the polymer material in thicknesses of about 1000 angstroms to about 10 microns, electron beam radiation from $10^{-6}$ coulombs/cm$^2$ to about $10^{-3}$ coulombs/cm$^2$ and preferably from about $10^{-5}$ to about $10^{-4}$ coulombs/cm$^2$, and at an accelerating potential in the range from about 1 to above 50 kv and preferably from about 10 to 30 kv are employed.

After exposure, the exposed portions of the polymeric film (the degraded products of lower molecular weight) are removed with a suitable solvent which has a markedly lower solubility for the unexposed areas of the polymer resist. The present invention provides greater degradation of the polymer chain by exposure than is achieved with homopolymers of polymethyl methacrylate and the like.

The exposed portions are generally removed with the solvent at temperatures in the range of from about 10° C. to about 100° C. Generally the development time ranges from about 1 to about 60 minutes and preferably between about 5 and 15 minutes. Of course, the development time can be altered by such factors as the particular polymeric material employed, the thickness of the film, the particular solvent system employed, the particular temperature employed for the development step and the exposure dose.

Various types of solvent systems or developing processes can be used. For instance, a solvent system which is a good solvent for both the exposed and unexposed polymers can be employed when particularly fast processes are desirable. In such a system, the thickness of the polymeric material is adjusted so that the remaining unexposed film is thick enough to protect the substrate during subsequent treatment.

Also, if desired, a solvent system which is only a solvent for the exposed areas can be used in the development. Another means of development is to employ a mixture of a solvent capable of dissolving the polymeric material regardless of its molecular weight and a liquid which is incapable of dissolving the polymeric material regardless of its molecular weight in proportions sufficient to dissolve only the exposure portions.

Some examples of suitable solvents developers include methyl ethyl ketone, liquid carboxylic acids, ketones, cellosolves, chlorinated hydrocarbons e.g. chlorobenzene, chloroform, Dimethyl formamide, Dimethyl Sulfoxide or mixtures of the above or mixture with water or alcohols or other organic solvents or nonsolvents e.g. hexane, petroleum ether, alkanes etc.

The pattern resist image may be postbaked to remove the developer solvents. Normally the temperatures used should be below the melting point or glass transition temperature of the polymeric film. Generally the temperature of postbaking is from about 130° C. to about 160° C. depending upon the particular polymeric material employed. In contrast, when using prior art poly methyl methacrylate or poly olefin sulfones, only temperatures up to 135° C. can be employed. The increased thermostability achieved by the present invention is useful in lift off metallurgical processing in which the metal is preferentially deposited at elevated temperatures.

Compared to polymethyl methacrylate (PMMA) the lead methacrylate copolymers have better sensitivity and contrast, equal film forming ability, better temperature stability.

During reactive ion, ion, sputter or plasma etching, bombardment of the wafer by charged species raises its temperature. If the temperature is high enough the resist may break down chemically or begin to melt and flow. In either case the fidelity of the etched pattern will deteriorate. The improved temperature stability of the lead methacrylate copolymers postpones the onset of this degradation. This allows higher powers to be used in the etching tool, increasing throughout and reducing costs.

Lift off metalization is often used when high resolution patterns are needed. Quite often it is necessary to heat the substrate so that the evaporated metal may stick to it better. Permalloy of magnetic bubble overlay patterns is an example. If the temperature is too high the resist mask may flow and thus the undercut profile-essential for successful lift off will be lost. Because the lead methacrylate copolymers flow at a temperature about 25°-30° C. above that of PMMA higher substrate temperature can be used and better adhesion can be obtained. The effects of radiant heating from the evaporation source are also minimized.

The following nonlimiting examples are provided to further demonstrate the present invention.

EXAMPLE A

Copolymer of 99.72 mole % methyl methacrylate and 0.28 mole % Pb methacrylate.

9.5 grams of methyl methacrylate and 0.5 grams of Pb methacrylate are dissolved in 5 ml of glacial acetic acid in a pressure bottle. About 50 mg of azobisisobutyronitrile are then added. The pressure bottle is capped and heated to 78° C. for about ½ hour.

The polymer is precipitated from solution by adding chloroform and then methyl alcohol to the polymerization solution. The precipitated polymeric material is then dissolved in chloroform and reprecipitated in methyl alcohol. The polymer is washed with methyl alcohol and dried in vacuum at about 10 mm of pressure at room temperature to thereby provide about 2.5 grams of polymer.

Atomic absorbtion spectrophotometry demonstrates that it is a copolymer of 99.72 mole % methyl methacrylate and 0.28 mole % Pb methacrylate. The polymer has a $M\bar{w}$ of about $180 \times 10^3$ and a $M\bar{n}$ of about $95 \times 10^3$.

EXAMPLE B

Copolymer of 99.7 mole % methyl methacrylate and 0.30 mole % barium methacrylate.

9 Grams of methyl methacrylate and about 1 grams of Ba methacrylate are dissolved 10 mls of glacial acetic acid. About 50 mg of azobisisobutyronitrile are then added to the pressure bottle. The pressure bottle is then capped and heated to a temperature of about 78° C. for about ½ hour. The polymer is precipitated from solution by addition of chloroform and then methyl alcohol. The precipitated polymer is then dissolved in chloroform and reprecipitated in methyl alcohol.

The polymer is then vacuum dried at about 10 mm of pressure at room temperature to provide about 2 grams of polymer. Atomic absorbtion spectrophotometry of the copolymer demonstrates that it is a copolymer of about 99.7 mole % methyl methacrylate and 0.3 mole % Ba methacrylate. The polymer has an average molecular weight of about $90 \times 10^3$.

EXAMPLE C

Copolymer of 99.92 mole % methylmethacrylate and 0.08 mole % of Ca methacrylate.

The method of preparation disclosed in examples A and B above is used except that 9 grams of methyl methacrylate and 1 grams of Ca methacrylate are dissolved in 10 mls of glacial acetic acid. Atomic absorbtion spectrophotometry of the copolymer demonstrates that it is a copolymer of about 99.92 mole % of methyl methacrylate and 0.08 mole % Ca methacrylate and contains about 0.032% Ca. The polymer has a $M\bar{w}$ of about 180K and a $M\bar{n}$ of about 90K.

EXAMPLE D

Copolymer of 99.987 mole % methyl methacrylate and 0.013 mole % of Sr methacrylate.

The method of preparation disclosed in examples A and b above is used except that 8.5 grams of methyl methacrylate and 1.5 grams of Sr methacrylate are dissolved in 10 mls of glacial acetic acid.

Atomic absorbtion spectrophotometry of the copolymer demonstrates that it is a copolymer of about 99.987 mole % methyl methacrylate and 0.013 mole % Sr methacrylate contains 0.011% Sr. The polymer has a $M\overline{\omega}$ of about $180\times10^3$ and a $M\overline{n}$ of about $100\times10^3$.

EXAMPLE E

Copolymer of 98.51 mole % methyl methacrylate and 1.49 mole % Pb methacrylate.

The method of preparation disclosed in examples A and B above is used except that 9 grams of methyl methacrylate and 1 gram of Pb methacrylate are dissolved in 3 mls of glacial acetic acid.

Atomic absorbtion spectrophotometry of the copolymer demonstrates that it is a copolymer of about 98.5 mole % and about 1.5 mole % Pb methacrylate and contains 2.96% Pb. The polymer has a $M\overline{\omega}$ of about $200\times10^3$ and a $M\overline{n}$ of about $100\times10^3$.

EXAMPLE F

Copolymer of 97.25 mole % methyl methacrylate and 2.75 mole % Pb methacrylate.

The method of preparation disclosed in examples A and B is used except that 8.5 grams of methyl methacrylate and 1.5 grams of Pb methacrylate are dissolved in 10 of glacial acetic acid. The polymer has a $M\overline{\omega}$ of about $200\times10^3$ and a $M\overline{n}$ of about $100\times10^3$. The atomic absorbtion spectrophotometry of the copolymer shows that it is a copolymer of about 97.25 mole % methyl methacrylate and about 2.75 mole % Pb methacrylate.

Examples G–U are given in the following Table 1.

TABLE I

| POLYMER COMPOSITIONS | |
|---|---|
| POLYMER | wt. % metal |
| 85/15Ba20 | .17 |
| 85/15Ba10 | .24 |
| 90/10Ba10 | .41 |
| 95/5Ba10 | .08 |
| 95/5Pb10 | .58 |
| 90/10Pb10 | .81 |
| 90/10Pb3 | 2.96 |
| 85/15Pb10 | 5.30 |
| 95/5Ca10 | .027 |
| 90/10Ca10 | .032 |
| 85/15Ca10 | .027 |
| 95/5Sr10 | .019 |
| 90/10Sr10 | .003 |
| 85/15Sr10 | .011 |

Polymer designation is a/bMEc. where:
a is the No. of ml. of methyl methacrylate (X10)
b is the No. of g. of metal methacrylate (X10)
ME is the metal ion incorporated
c is the number of ml. of acetic acid used.

The compositions shown therein were prepared by the methods disclosed in Examples A–F. The polymer designation is a/bMEc where a is the number of milliliters of methyl methacrylate (X10), b is the number of g of metal metal methacrylate (X10) ME is the metal incorporated and c is the number of milliliters of glacial acetic acid used in the reaction solution.

EXAMPLE 1

About a 10 weight % solution of a copolymer made from a mixture of 90 mole % methyl methacrylate and 10 mole % Pb methacrylate prepared in accordance with Example E, and having a $M\overline{\omega}$ of about 180K and $M\overline{n}$ of about look and a thermal stability about 160° C. in ethyl cellosolve acetate is obtained. A film of about 0.5 microns of the copolymers on a 0.5 microns $SiO_2$ layer is obtained by spin casting the copolymer solution at about 1000 rpm. The film is then prebaked at about 160° C. for 1 hour. The film is then exposed in a vacuum with a 0.1 μm diameter electron beam to a dose of $3\times15^5 C/cm^2$ at 20 kv. The film is developed in methyl ethyl ketone at 25° C. for 2 minutes. The exposed region is removed by the solvent yielding a positive image. The net film thickness remaining in the unexposed region is about 90% of the original thickness. The sample is rinsed in ethanol and dried at 70° C. for 10 minutes. The oxide layer is etched with buffered HF at 21° C. to yield 0.5μ images for diffusing doping. The film is stripped in 5 minutes in ethyl cellosolve at 70° C. followed by a water rinse and oven drying. No residue remained after stripping.

EXAMPLE 2

A copolymer having a $M_w$ of 200,000 made from 9 parts methyl methacrylate and 1 part lead methacrylate is dissolved in ethyl cellosolve acetate to make a 10% solution by weight. This is spun on to a garnet wafer at a speed of 2000 rpm. A film approximately 1.2 μm thick is formed. The wafer is baked at 160° for 1 hour. It is then exposed by a beam of 20 keV electrons, which is 0.1 μm in diameter. The exposure used is $3\times10^{-5}$ C $cm^{-2}$. The wafer is then developed for about 2 minutes in methyl ethyl ketone at room temperature. The pattern exposed at this dose now shows the undercut profile necessary for lift-off metallization.

The wafer is placed in a vacuum system and it is heated to 160° C. 1.0 μm of nickel iron alloy is evaporated on to it. The wafer is removed and immersed in ethyl cellosolve acetate at 70° C. to dissolve the resist and float off the unwanted metal. A high resolution pattern is obtained.

EXAMPLES 3–12

Figure 2:
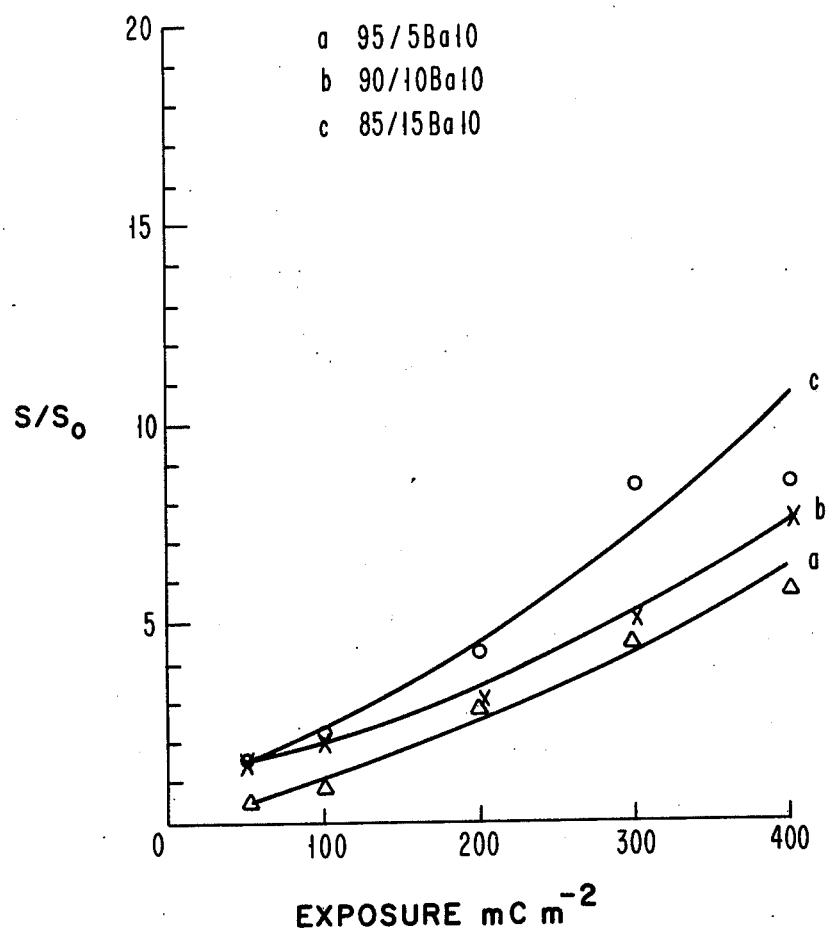
FIG. 2 is a graph displaying the solubility ratio of Barium Methacrylate copolymers.
Figure 3:
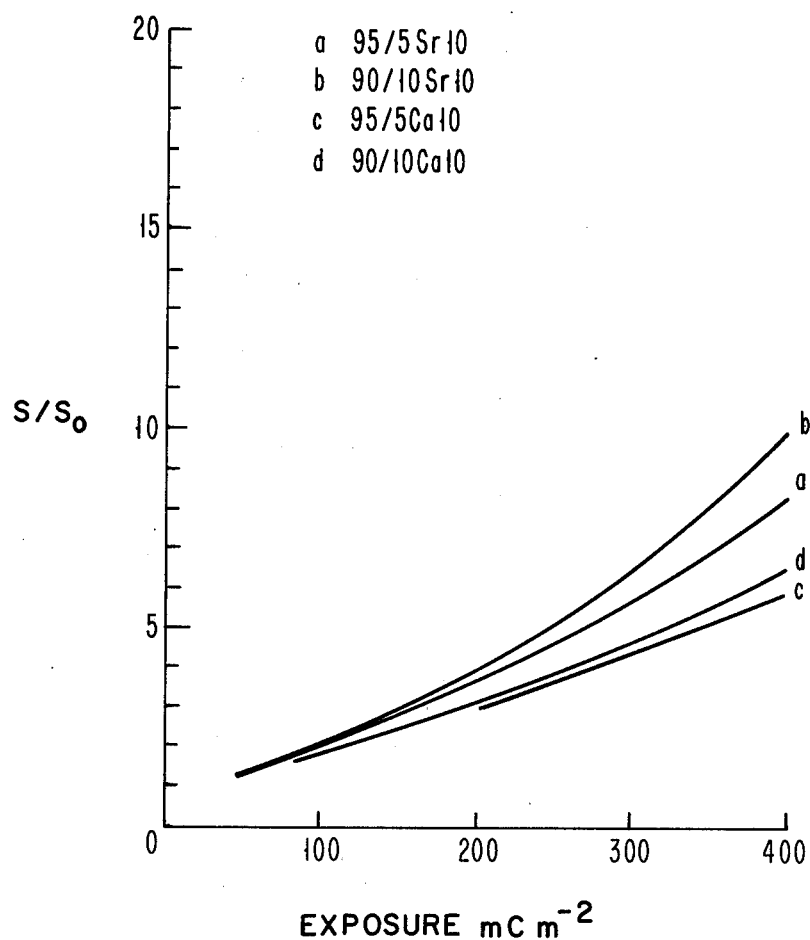
FIG. 3 is a graph displaying the solubility ratio of Strontium Methacrylate and calcium methacrylate copolymers.
Figure 4:
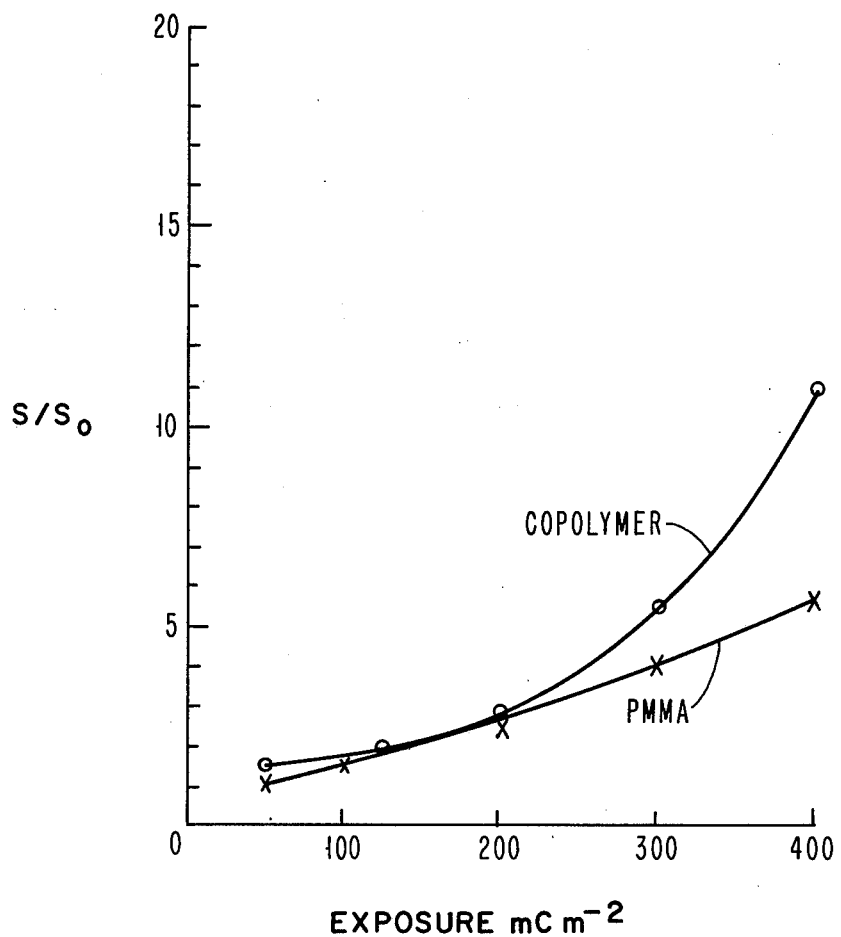
FIG. 4 is a graph displaying the solubility of methyl methacrylate and its copolymer with methacrylic acid.

Some films were prepared from the compositions obtained in Examples A–U according to the method disclosed in Example 1. The solubility ratio were determined and are disclosed in FIGS. 1–3.

COMPARISON EXAMPLE 13

(Prior Art)

About 10 weight % solution of a polymethyl methacrylate of $M\overline{\omega}$ of about $2\times10^5$ and thermal stability of 120° C. is obtained. A film of about 0.5 microns of the polymer on a 0.5 microns substrate of thermal oxide of silicon is obtained by spin casting the polymer solution at 3000 rpm. The film is then prebaked at about 160° C. for about 1 hour. The film is then exposed in vacuum with a 0.1 μm diameter electron beam to a dose of $10^{-4}$ coulombs/$cm^2$ at 20 kv. The film is developed a methyl isobuty/ketone at 20° C. for 4 minutes. The exposed region is removed by the solvent yielding a positive image. The net film thickness remaining in the unexposed region is about 90% of the original thickness. The sample is rinsed in isopropanol and dried at 70° C. for 10 minutes. The 0.5 micron oxide is etched with buffered HF at 21° C. to yield 0.5μ images for diffusion doping. The film is stripped in 5 minutes in EC at 70° followed by a ethanol rinse and oven drying.

EXAMPLE 14

(Prior Art)

Polymethyl methacrylate having an $M_w$ of 200,000 is dissolved in ethyl cellosolve acetate to make a solution 10% by weight of polymer. It is spun onto a garnet wafer at 3000 rpm. A film approximately 1.2 μm thick is formed. The wafer is baked at 160° C. for one hour.

The pattern is exposed in the resist using a 0.1 μm diameter beam of 20 keV electrons. In order to obtain the undercut profile required for lift-off it is necessary to expose the pattern with a dose of $10 \times 10^{-5C}$ cm$^{-2}$.

After exposure the wafer is developed in about 3 minutes in methyl isobutyl ketone at room temperature. The wafer is then placed in the vacuum system in which the nickel-iron alloy will be evaporated. Because the resist will begin to flow, the maximum substrate temperature permitted during evaporation is 120° C. 1.0 μm of nickel iron is evaporated.

The wafer is removed and immersed in ethyl cellosolve acetate at a temperature of 70° C. to dissolve the resist and "lift off" the unwanted metal.

A high resolution nickel iron overlay pattern is obtained, but because of the lower substrate temperatures used during evaporation the adhesion of the metal layer is not as good.

A comparison of Examples 1-12 with Examples 13 and 14 illustrates that the sensitivity of polymethylmethacrylate can be improved by a factor of 3 where copolymerized with a metal methacrylate. The solubility ratios are shown in FIGS. 1-4.

It can be stated that in order to expose a pattern with a given solubility ratio it is necessary to use about 3 times as much radiation when PMMA is exposed than when the lead methacrylate polymers of the present invention are exposed.

This may be stated another way. The useful exposure range for the best lead methacrylate copolymer is $0.5 \times 10^{-5}$ to $3 \times 10^{-5}$ coulombs/cm$^2$. In this range it has a solubility ratio of between 2:1 and 10:1 whereas the solubility ratio of PMMA is between 1.1:1 and 4:1 approximately. The contrast of the lead methacrylate copolymers is thus approximately twice that of PMMA. In order to obtain the same solubility ratios the exposure of PMMA must be increased to between $2 \times 10^{-5}$ and $10 \times 10^{-5}$C cm$^{-2}$. Thus the sensitivity of PMMA is a factor of 3 worse than the lead methacrylate copolymers.

It is important that the sensitivity of the resist be as high as possible since this increases the rate at which wafers can be exposed in a given tool and hence reduces the cost of the final product.

Having thus described our invention, what we claim as new, and desire to secure by Letters Patent is:

1. A method for the production of a positive resist image comprising the steps of:
   (A) exposing a film of a non crosslinked polymeric material to electron beam radiation in a predetermined pattern wherein the polymeric material is comprised of:
   (a) polymerized alkyl methacrylate units wherein the alkyl group contains 1 to 4 carbon atoms and
   (b) polymerized units of a methacrylate salt of a metal chosen from the group consisting of barium, calcium, lead and strontium and
   wherein the amount of said alkyl methacrylate units (a) is from about 50 to about 99.99 mole % and the amount of the metal salt of methacrylic acid (b) is from about 50 to about 0.001 mole % based upon the total moles of (a) and (b) in said polymeric materials and
   wherein said metal present is in the amount of from about 0.001 to about 10% by weight of the copolymer;
   (B) continuing said exposure until substantial degradation of said polymeric material to lower molecular weight products is achieved in the exposed areas; and
   (C) removing the degraded products in the exposed areas.

2. The method of claim 1 wherein said polymeric material consists essentially of a copolymer of said alkyl methacrylate and the metal salt of methacrylic acid.

3. The method of claim 1 wherein said polymeric material consists essentially of a copolymer of said alkyl methacrylate and the barium salt of methacrylic acid.

4. The method of claim 1 wherein said polymeric material consists essentially of a copolymer of said alkyl methacrylate and the calcium salt of methacrylic acid.

5. The method of claim 1 wherein said polymeric material consists essentially of a copolymer of said alkyl methacrylate and the lead salt of methacrylic acid.

6. The method of claim 1 wherein said polymeric material consists essentially of a copolymer of said alkyl methacrylate and the strontium salt of methacrylic acid.

7. The method of claim 3 wherein said barium is present in the amount of about 0.05 to about 0.45% by weight of the copolymer.

8. The method of claim 4 wherein said calcium is present in the amount of about 0.02 to about 0.035% by weight of the copolymer.

9. The method of claim 5 wherein said lead is present in the amount of about 1% to about 4% by weight of the copolymer.

10. The method of claim 6 wherein said strontium is present in the amount of from about 0.003 to about 0.02% by weight of the copolymer.

* * * * *